US009191742B1

(12) United States Patent
Worley, III

(10) Patent No.: US 9,191,742 B1
(45) Date of Patent: Nov. 17, 2015

(54) ENHANCING AUDIO AT A NETWORK-ACCESSIBLE COMPUTING PLATFORM

(71) Applicant: Rawles LLC, Wilmington, DE (US)

(72) Inventor: William Spencer Worley, III, Half Moon Bay, CA (US)

(73) Assignee: Rawles LLC, Wilmington, DE (US)

( * ) Notice: Subject to any disclaimer, the term of this patent is extended or adjusted under 35 U.S.C. 154(b) by 356 days.

(21) Appl. No.: 13/753,228

(22) Filed: Jan. 29, 2013

(51) Int. Cl.
*H04B 3/00* (2006.01)
*H03G 3/00* (2006.01)
*G10L 21/00* (2013.01)
*G06F 17/00* (2006.01)
*H04B 7/24* (2006.01)
*H04R 3/04* (2006.01)
*H04W 4/02* (2009.01)
*G10L 19/16* (2013.01)
*H04R 5/04* (2006.01)
*H03G 1/02* (2006.01)
*H04W 4/00* (2009.01)

(52) U.S. Cl.
CPC ................ *H04R 3/04* (2013.01); *G10L 19/167* (2013.01); *H04R 5/04* (2013.01); *H04W 4/025* (2013.01); *H03G 1/02* (2013.01); *H03G 3/001* (2013.01); *H04W 4/00* (2013.01)

(58) Field of Classification Search
None
See application file for complete search history.

(56) References Cited

U.S. PATENT DOCUMENTS

| 6,859,538 | B1* | 2/2005 | Voltz ............................... 381/77 |
| 7,418,392 | B1 | 8/2008 | Mozer et al. |
| 7,720,683 | B1 | 5/2010 | Vermeulen et al. |
| 7,774,204 | B2 | 8/2010 | Mozer et al. |
| 2011/0040397 | A1* | 2/2011 | Kraemer et al. ................ 700/94 |
| 2012/0223885 | A1 | 9/2012 | Perez |
| 2014/0064513 | A1* | 3/2014 | Behringer ........................ 381/77 |
| 2014/0372624 | A1* | 12/2014 | Wang et al. .................... 709/231 |

FOREIGN PATENT DOCUMENTS

WO    WO2011088053 A2    7/2011

OTHER PUBLICATIONS

Pinhanez, "The Everywhere Displays Projector: A Device to Create Ubiquitous Graphical Interfaces", IBM Thomas Watson Research Center, Ubicomp 2001, Sep. 30-Oct. 2, 2001, 18 pages.

* cited by examiner

*Primary Examiner* — Andrew L Sniezek
(74) *Attorney, Agent, or Firm* — Lee & Hayes, PLLC

(57) ABSTRACT

Techniques for enhancing audio at a network-accessible computing platform and then providing the enhanced audio to a client device. By enhancing the audio remotely at the computing platform rather than locally at the client device, the client device need not include the infrastructure (e.g., hardware and software) required to perform these audio enhancements. Therefore, the client device may be manufactured at a lesser expense as compared to devices that perform the enhancements themselves. Instead, the client devices described herein simply receive the pre-enhanced audio and directly output this audio.

20 Claims, 8 Drawing Sheets

ENHANCING AUDIO AT A NETWORK-ACCESSIBLE COMPUTING PLATFORM

BACKGROUND

Many of today's electronic devices include technology to enhance the quality of audio output by these devices. Enhancing the audio quality in this manner often enhances the experience of users consuming content with these devices. For instance, surround sound, dynamic range modification and other technologies are all examples of innovation that have increased the enjoyment of users consuming digital content on a variety of electronic devices. However, because the underlying infrastructure required to implement these technologies resides on the electronic devices themselves, the overall cost of these devices is often greater as compared to electronic devices that do not include the infrastructure for implementing these technologies.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
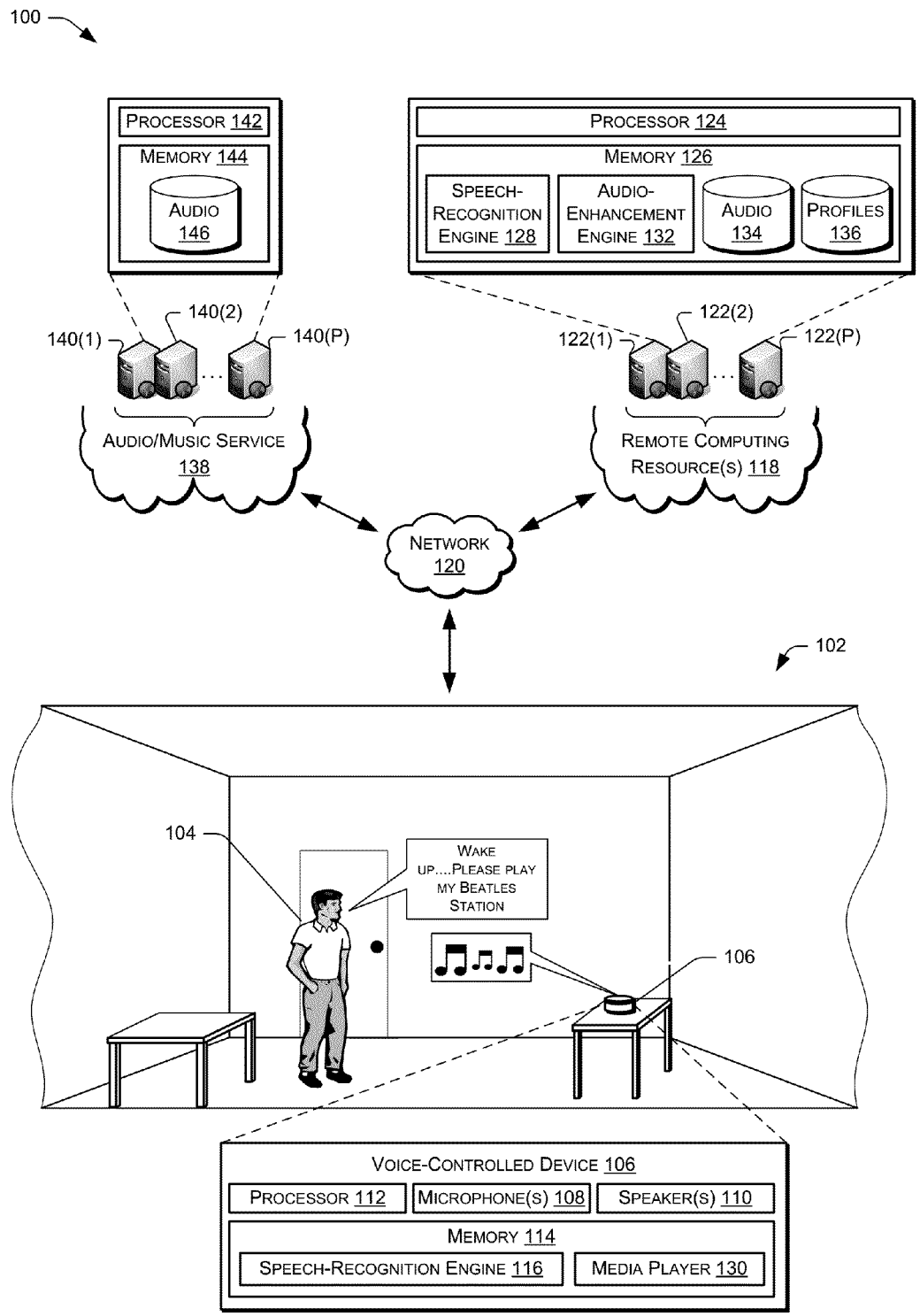
FIG. 1 shows an illustrative voice interaction computing architecture set in a home environment. The architecture includes a voice-controlled device physically situated in the home, along with a user who is able to provide voice commands to the device. The device is also able to output audio back to the user, such as music, audio books, and the like. As described herein, one or more remote computing resources may enhance the quality of the audio prior to the providing the audio to the device for output in the environment. Because these remote resources enhance the audio, the device itself does not need to house the infrastructure necessary for enhancing the audio.

This disclosure describes, in part, techniques for enhancing audio at a network-accessible computing platform and then providing the enhanced audio to a client device. As described further below, the network-accessible computing platform may comprise one or more computing resources that are remote from the client device. By enhancing the audio remotely at the remote computing resources rather than locally at the client device, the client device need not include the infrastructure (e.g., hardware and software) required to perform these audio enhancements. Therefore, the client device may be manufactured at a lesser expense as compared to devices that perform the enhancements themselves. Instead, the client devices described below may simply receive the pre-enhanced audio and directly output this audio.

For instance, envision that a user of a client device wishes to stream a particular audio file to the client device, with the audio file being stored at a remote location. The remote computing resources may receive the user's request and, in response, may first identify a characteristic associated with the client device in order to determine how best to enhance or otherwise modify the audio. For instance, the remote computing resources may reference a make, model, manufacturer, or frequency response of a speaker associated with the requesting client device. In addition, the resources may determine a class of audio file being requested (e.g., music, non-music, audio book, etc.). In the latter instances, a particular equalization may be selected for the audio based on the class of audio.

In addition, the remote computing resources may obtain the requested audio. For instance, the resources may store the audio file locally and, hence, may retrieve the local audio file, or the resources may obtain the audio file from another entity that stores the audio file. After obtaining the audio file, the remote computing resources may enhance the audio in some manner based on the characteristic of the client device (e.g., the frequency response of the speaker on which the audio file will be played) and/or based on the type of audio file. Thereafter, the resources may stream the enhanced audio back to the client device. Again, the device is then able to receive and output the enhanced audio without the need to perform the enhancement(s) itself.

Enhancing the audio may include altering an amplitude of a frequency of the audio (e.g., altering frequency-band amplitudes), altering amplitude of the audio, or the like, with these enhancements being based on particular characteristics of the client devices that are going to output the audio. For instance, the remote computing resources may perform equalization to the audio, modify a dynamic range of the audio, apply a certain set of audio technologies to the audio (e.g., Dolby Digital®), or may enhance or modify the audio in any other way. The resources may take a variety of factors into account when determining how to enhance the audio, including characteristic(s) of the client device, a type of the audio that the client device is going to output, user preferences, and the like.

The devices and techniques described above and below may be implemented in a variety of different architectures and contexts. One non-limiting and illustrative implementation is described below. It is specifically noted that while the techniques are described with reference to a voice-controlled device, these techniques may apply to any client computing device capable of outputting audio and receiving audio over a network from remote computing device(s).

FIG. 1 shows an illustrative voice interaction computing architecture 100 set in a home environment 102 that includes a user 104. The architecture 100 also includes an electronic voice-controlled device 106 with which the user 104 may interact. In the illustrated implementation, the voice-controlled device 106 is positioned on a table 148 within a room of the home environment 102. In other implementations, it may be placed or mounted in any number of locations (e.g., ceiling, wall, in a lamp, beneath a table, under a chair, etc.). Further, more than one device 106 may be positioned in a single room, or one device may be used to accommodate user interactions from more than one MOM.

Generally, the voice-controlled device 106 includes a microphone unit that includes at least one microphone 108 and a speaker unit that includes at least one speaker 110 to facilitate audio interactions with the user 104 and/or other users. In some instances, the voice-controlled device 106 is implemented without a haptic input component (e.g., keyboard, keypad, touch screen, joystick, control buttons, etc.) or a display. In certain implementations, a limited set of one or more haptic input components may be employed (e.g., a dedicated button to initiate a configuration, power on/off, etc.). Nonetheless, the primary and potentially only mode of user interaction with the electronic device 106 may be through voice input and audible output. One example implementation of the voice-controlled device 106 is provided below in more detail with reference to FIG. 6.

The microphone(s) 108 of the voice-controlled device 106 detects audio from the environment 102, such as sounds uttered from the user 104, and generates a corresponding audio signal. As illustrated, the voice-controlled device 106 includes a processor 112 and memory 114, which stores or otherwise has access to a speech-recognition engine 116. As used herein, a processor may include multiple processors and/or a processor having multiple cores. The speech-recognition engine 116 performs audio recognition on signals generated by the microphone(s) based on sound within the environment 102, such as utterances spoken by the user 104. For instance, the engine 116 may identify both speech (i.e., voice commands) of the user and non-speech commands (e.g., a user clapping, tapping a table, etc.). The voice-controlled device 106 may perform certain actions in response to recognizing this audio, such as speech from the user 104. For instance, the user may speak predefined commands (e.g., "Awake", "Sleep", etc.), or may use a more casual conversation style when interacting with the device 106 (e.g., "I'd like to go to a movie. Please tell me what's playing at the local cinema.").

In some instances, the voice-controlled device 106 may operate in conjunction with or may otherwise utilize computing resources 118 that are remote from the environment 102. For instance, the voice-controlled device 106 may couple to the remote computing resources 118 over a network 120. As illustrated, the remote computing resources 118 may be implemented as one or more servers 122(1), 122(2), . . . , 122(P) and may, in some instances, form a portion of a network-accessible computing platform implemented as a computing infrastructure of processors, storage, software, data access, and so forth that is maintained and accessible via a network such as the Internet. The remote computing resources 118 do not require end-user knowledge of the physical location and configuration of the system that delivers the services. Common expressions associated for these remote computing resources 118 include "on-demand computing", "software as a service (SaaS)", "platform computing", "network-accessible platform", "cloud services", "data centers", and so forth.

The servers 122(1)-(P) include a processor 124 and memory 126, which may store or otherwise have access to some or all of the components described with reference to the memory 114 of the voice-controlled device 106. In some instances the memory 126 has access to and utilizes another speech-recognition engine 128 for receiving audio signals from the device 106, recognizing audio (e.g., speech) and, potentially, causing performance of an action in response. In some examples, the voice-controlled device 106 may upload audio data to the remote computing resources 118 for processing, given that the remote computing resources 118 may have a computational capacity that far exceeds the computational capacity of the voice-controlled device 106. Therefore, the voice-controlled device 106 may utilize the speech-recognition engine 128 at the remote computing resources 118 for performing relatively complex analysis on audio captured from the environment 102. In one example, the speech-recognition 116 performs relatively basic audio recognition, such as identifying non-speech commands for the purpose of altering audio output by the device and identifying a predefined voice command that, when recognized, causes the device 106 to provide the audio the remote computing resources 118. The speech-recognition engine 128 of the remote computing resources 118 may then perform speech recognition on these received audio signals to identify voice commands from the user 104. For instance, in some examples the engine 116 may simply function as a keyword spotter to identify one or more predefined utterances, while the engine 128 may identify words within the speech represented by audio signals generated by the device 106. In these examples, a cost of the voice-controlled device 106 may be lessened, given that the speech-recognition engine 116 is fairly simple and inexpensive to provide on the device 106.

Regardless of whether the speech recognition occurs locally or remote from the environment 102, the voice-controlled device 106 may receive vocal input from the user 104 and the device 106 and/or the resources 118 may perform speech recognition to interpret a user's operational request or command. The requests may be for essentially type of operation, such as authentication, database inquires, requesting and consuming entertainment (e.g., gaming, finding and playing music, movies or other content, etc.), personal information management (e.g., calendaring, note taking, etc.), online shopping, financial transactions, and so forth.

The voice-controlled device 106 may communicatively couple to the network 120 via wired technologies (e.g., wires, USB, fiber optic cable, etc.), wireless technologies (e.g., RF, WiFi, cellular, satellite, Bluetooth, etc.), or other connection technologies. The network 120 is representative of any type of communication network, including data and/or voice network, and may be implemented using wired infrastructure (e.g., cable, CAT5, fiber optic cable, etc.), a wireless infrastructure (e.g., RF, WiFi, cellular, microwave, satellite, Bluetooth, etc.), and/or other connection technologies.

As illustrated, the memory 114 of the voice-controlled device 106 also stores or otherwise has access to the speech-recognition engine 116 and a media player 130. The media player 130 may function to output any type of content on any type of output component of the device 106. For instance, the media player may output audio of a video or standalone audio via the speaker(s) 110. For instance, the user 104 may interact (e.g., audibly) with the device 106 to instruct the media player 130 to cause output of a certain song or other audio file.

In the illustrated example, for instance, the user 104 issues the following utterance: "Wake up . . . please play my Beatles station". In this example, the speech-recognition engine 116 is configured to analyze audio signals generated by the microphone(s) to identify a match between a user utterance and a predefined utterance. In this example, the predefined utterance comprises the phrase "wake up". As such, the engine 116 recognizes this utterance of the user 104 and, in response, the device 106 begins uploading subsequent audio signals generated by the microphone(s) 108 to the remote computing resources 118 for analysis by the speech-recognition engine 128.

In this example, the engine 128 recognizes the user's command to begin playing the user's "Beatle station" (e.g., an Internet radio station). As such, the remote computing resources may comply with the user's request and will stream or otherwise help provide the requested audio to the device 106 for output on the speaker(s) 110. Before doing so, however, the remote computing resources 118 may enhance the audio sent to the device. For instance, the resources 118 may determine a characteristic of the speaker(s) 110 and may equalize the audio, alter a dynamic range, apply a certain set of audio technologies (e.g., Dolby Digital®), and/or the like to the audio prior to the providing the audio to the device 106. In some instances, the remote computing resources 118 may enhance the audio according to preferences previously set by the user 104 and/or preferences associated with a particular application providing the audio. For instance, the user 104 may set the equalization according to his preference, which may vary between applications, between types of content, between different genres of music, and/or the like.

As illustrated, the memory 126 of the remote computing resources 118 also stores or otherwise has access to an audio-enhancement engine 132, audio 134, and one or more profiles 136 associated with client devices. The profiles 136 may identify certain characteristics associated with different client devices. For instance, the profiles 136 may identify the make, model, manufacturer, or frequency response of speakers associated with different client devices. The profiles 136 may be compiled based on information received from users (e.g., based on the user 104 identifying the device 104 and/or the speaker(s) of the device 106), based on information known about the device (e.g., knowing a priori the speaker(s) associated with the client device 106), or in any other manner.

In response to receiving a request to stream audio, the audio-enhancement engine 132 may determine how to enhance the requested audio prior to providing the audio back to the device. For instance, the request received from the client device 106 may include an identifier effective to identify the specific client device 106. This identifier may comprise a media access control (MAC) address or any other type of identifier in some instances. The engine 132 may then reference the profiles 136 to identify one or more characteristics of the client device 106, such as the type of speaker(s) associated with the client device. In addition, the audio-enhancement engine 132 may determine a type of content requested, such as whether the content is music or non-music (e.g., an audio book). Further, the engine 132 may take into account any particular preferences previously set by the user 104 or another user associated with the device 106.

In addition, after receiving the request to provide the audio to the client device 106, the remote computing resources 118 may obtain the requested audio. In some instances, the resources 118 may store the requested audio (as illustrated by audio 134). In other instances, meanwhile, the remote computing resources 118 may retrieve the audio from another entity, such as an audio/music service 138.

As illustrated, the audio/music service may be hosted one or more servers 140(1), 140(2), ..., 140(P) and may include a processor 142 and memory 144. As illustrated, the memory 144 may store or otherwise have access to audio 146. In some instances, the remote computing resources 118 request the audio 146 from the audio/music service 138 and, in response to receiving the audio, enhance the audio in one or more ways. For instance, the audio-enhancement engine 132 may perform equalization to the audio, dynamic range modification, or the like, with these enhancements being based on the characteristics of the client device 106 (e.g., the type of speaker(s) on the device), the type of the audio, preferences of the user 104, and/or the like.

Equalizing the audio includes applying band-pass filters to the audio in order to adjust bass or treble of the audio when output at a client device. That is, performing equalization may raise or lower frequency-band amplitudes of the audio in order to enhance highs or lows of the audio. Altering a dynamic range of the audio, meanwhile, may change a ratio between the smallest amplitude of the audio and the largest amplitude of the audio. That is, adjusting a dynamic range of the audio may essentially normalize or limit the output amplitude of the audio. Of course, while a few specific techniques are discussed, the remote computing resources 118 may alter the frequency amplitude, amplitude of the audio, or other characteristics of the audio in any other manner.

After enhancing the audio by somehow altering an amplitude of at least one frequency (e.g., a band of frequencies) and/or the amplitude of the audio, the remote computing resources 118 may provide the enhanced audio to the client device 106 for output on the speaker(s) 110. In response to receiving the audio, the device 106 is able to playback the enhanced audio without the need to enhance the audio locally. As such, the device 106 need not include the infrastructure (e.g., hardware and software) necessary for performing these enhancements.

In some instances described below, the microphone(s) 108 may generate audio signals that include the speaker(s) 110 outputting the enhanced audio. The client device 106 may then provide this signal back to the remote computing resources 118, which may analyze the audio signals to determine whether or not to re-enhance the audio (e.g., whether to again adjust the amplitude of the frequency and/or amplitude of the audio). This feedback may continue for some period of time, periodically, or continuously.

Figure 2A:
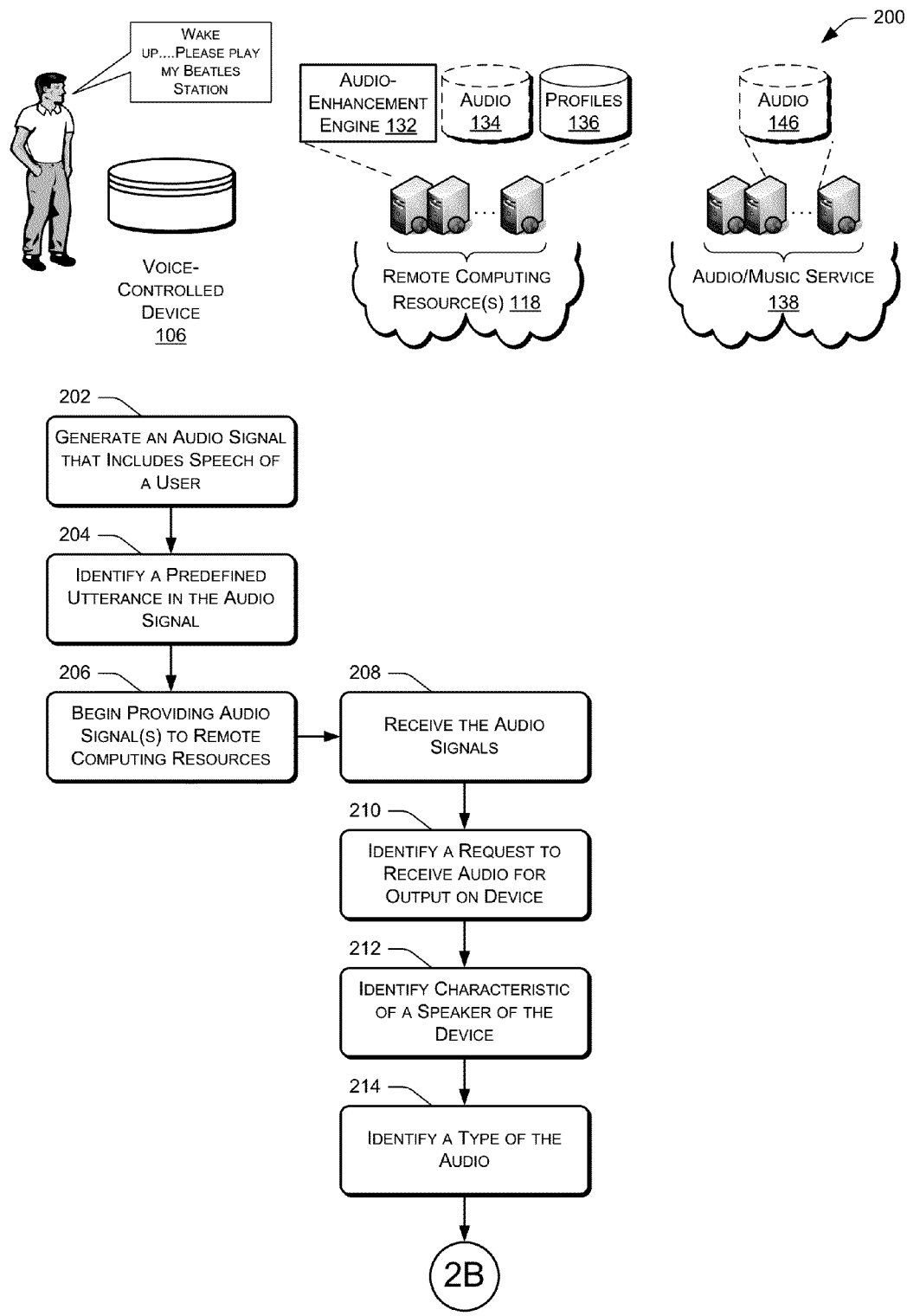
FIGS. 2A-C depict a flow diagram of an example process for enhancing audio at one or more computing resources that are remote from a client device and then providing the enhanced audio for playback at the client device.
Figure 2B:
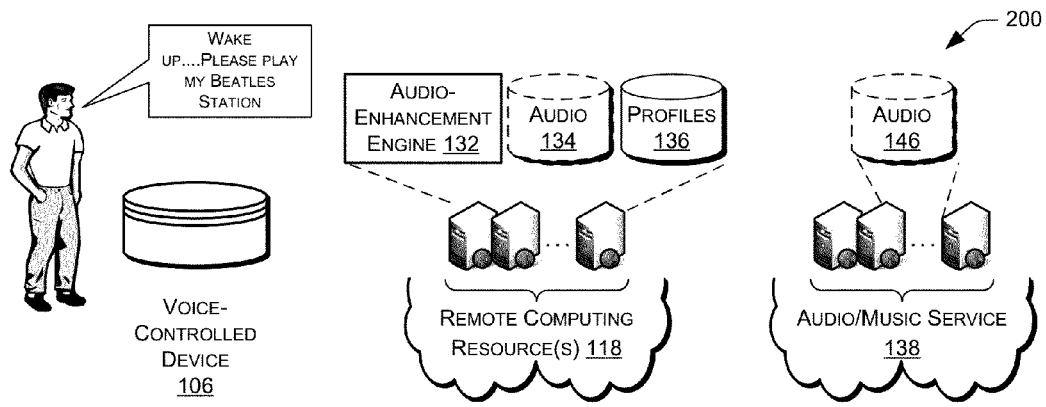
Figure 2B:
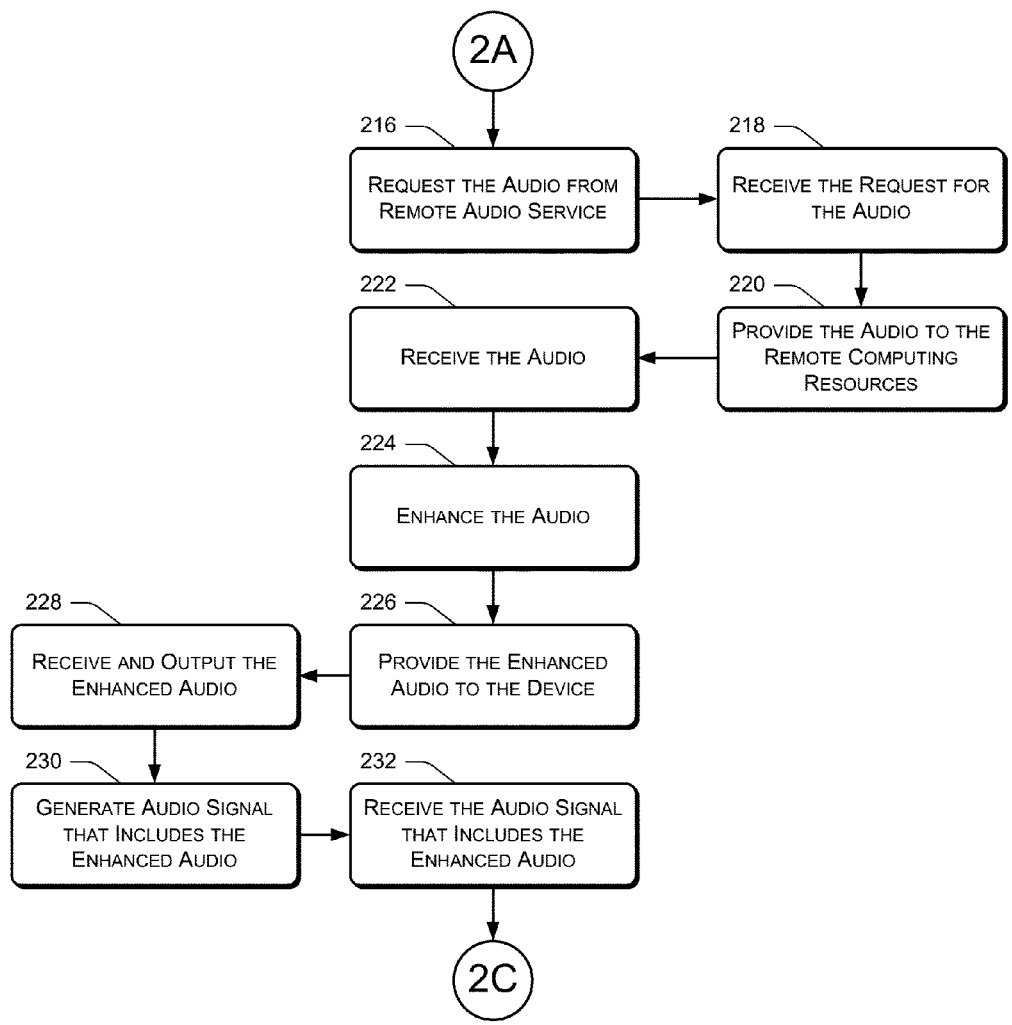
Figure 2C:
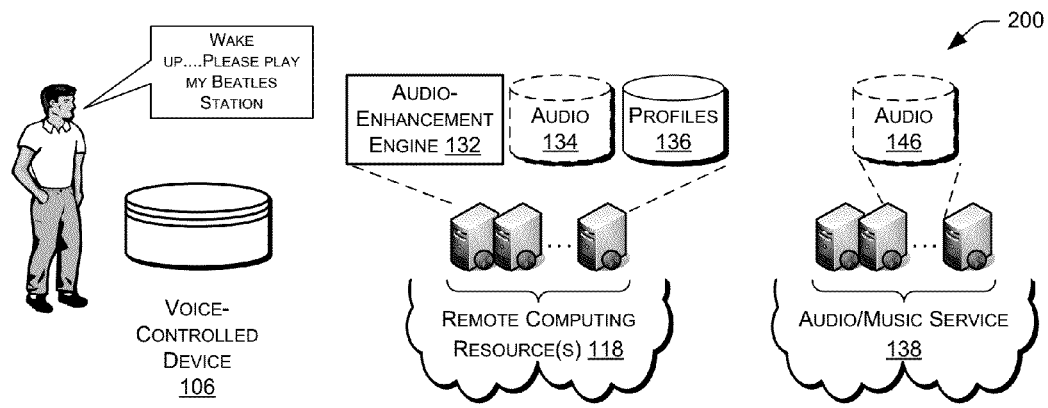
Figure 2C:
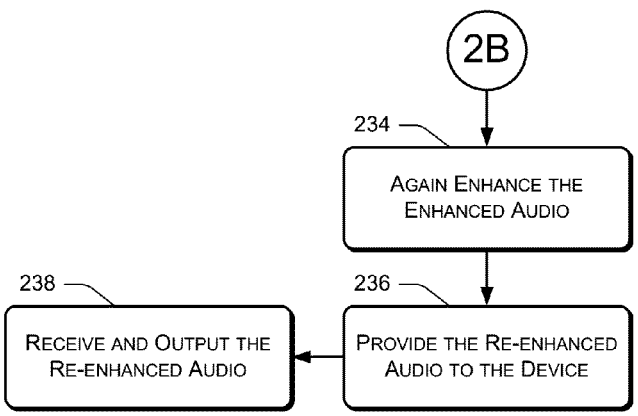

FIGS. 2A-C depict a flow diagram of an example process 200 for enhancing audio at the remote computing resources 118 and then providing the enhanced audio for playback at the voice-controlled device 106. In this example, operations illustrated underneath a respective entity may be performed by that entity. Of course, while FIG. 2 illustrates one implementation, it is to be appreciated that the operations may be performed by other entities in other implementations.

The process 200 (as well as each process described herein) is illustrated as a logical flow graph, each operation of which represents a sequence of operations that can be implemented in hardware, software, or a combination thereof. In the context of software, the operations represent computer-executable instructions stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer-readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some embodiments the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process.

At 202, the voice-controlled device 106 generates an audio signal that includes speech of a user. In this example, the speech includes the user stating the phrase "wake up", which is a pre-specified utterance for awakening the device 106. At 204, the device 106 performs speech recognition on the audio signal to identify the predefined utterance ("wake up") in the audio signal. In response to identifying this utterance, the device 106 begins providing audio signal(s) to the remote computing devices 118 at 206, with these audio signals being generated based on sound captured by a microphone(s) of the device 106.

At 208, the remote computing resources 118 receive the audio signals and, at 210, perform speech recognition to identify a request for audio within a received audio signal. In this example, the identified request comprises the user 104 stating "please play my Beatles station."

At 212, the remote computing resources identify a characteristic of a speaker of the device 106 that will output the requested audio. For instance, the resources 118 may reference the datastore of profiles 136 to determine the make, model, manufacturer, or frequency response of the speaker. At 214, the remote computing resources 118 may also identify a type of the requested audio, such as whether the requested audio is music, non-music (e.g., an audio book), etc.

FIG. 2B continues the illustration of the process 200. At 216, the remote computing resources 118 request the audio from an audio service 138. In this example, the audio service 138 is independent of and remote from the remote computing resources, although in other examples the remote computing resources 118 may store the requested audio itself. For instance, the resources 118 may store the audio in association with a user account of the user requesting the audio. In any event, in this example the audio service 138 receives the request for the audio at 218 and, at 220, provides the audio to the remote computing resources. The remote computing resources 118 then receive the audio at 222.

At 224, the remote computing resources 118 enhance the received audio by, for example, performing equalization to the audio, adjusting a dynamic range of the audio, applying a set of technologies to the audio (e.g., Dolby Digital®), or the like. As described herein, the remote computing resources 118 may determine how to enhance the audio based at least in part on the characteristic of the speaker of the client device and/or based at least in part on the type of audio content. In addition, and as discussed above, the remote computing resources may reference user preferences when determining how to enhance the received audio.

At 226, the remote computing resources 118 may provide the enhanced audio to the client device. The resources 118 may stream the enhanced audio, download the enhanced audio, or otherwise provide the audio to the voice-controlled device 106. At 228, the device 106 receives and outputs the enhanced audio, without needing to perform the enhancements locally.

In addition, the process 200 may implement a feedback loop to determine whether or not to re-modify (re-enhance) the audio. At 230, the voice-controlled device 106 generates an audio signal that includes the enhanced audio as output by the speaker of the device 106 and then provides this audio signal to the remote computing resources 118, which receives the signal(s) at 232.

FIG. 2C continues the illustration of the process 200 and includes the remote computing resources 118 again enhancing the enhanced audio at 234. For instance, the resources 118 may determine, based on the output, to re-adjust an amplitude of a frequency and/or amplitude of the audio. At 236, the resources 118 provide the re-enhanced audio to the device 106. At 238, the voice-controlled device 106 receives and outputs the re-enhanced audio.

Figure 3:
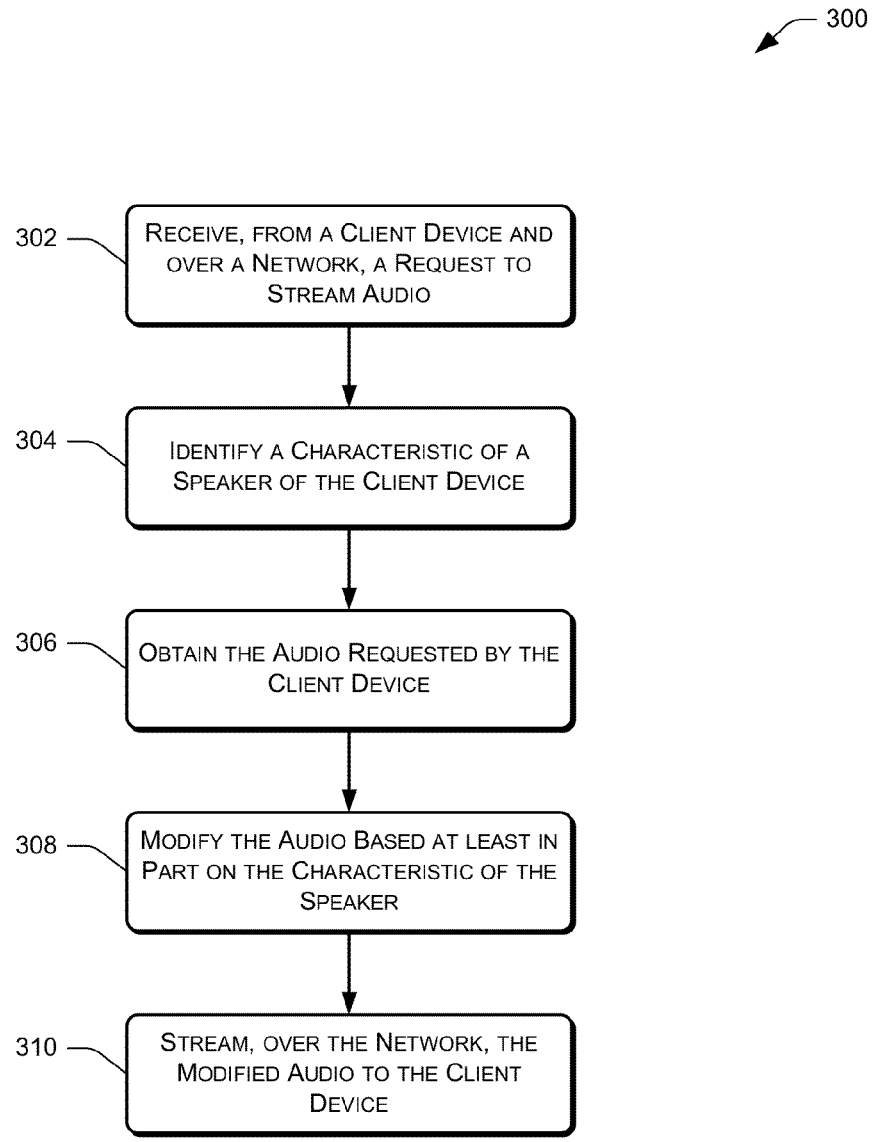
FIG. 3 depicts a flow diagram of an example process for modifying audio based on a characteristic of a speaker of a client device and then providing, over a network, the audio to the client device.

FIG. 3 depicts a flow diagram of an example process 300 for modifying audio based on a characteristic of a speaker of a client device and then providing, over a network, the audio to the client device. At 302, one or more computing devices receive, from a client device and over a network, a request to stream audio to the client device. For instance, the remote computing resources 118 may receive the request. At 304, the resources 118 identify a characteristic of a speaker of the client device that is requesting the audio. For instance, this may include identifying a make, model, manufacturer, frequency response, size, or other characteristic associated with the speaker.

At 306, the resources 118 may obtain the audio requested by the client device. As described above, the resources 118 may obtain the audio locally or from a remote service. At 308, the resources 118 modify the audio based at least in part on the characteristic of the speaker and, in some instances, according to user preferences or preferences specified by an application providing the audio. For instance, the resources may adjust an amplitude of a frequency and/or amplitude of the audio. At 310, the resources stream, over the network, the modified audio to the client device.

Figure 4:
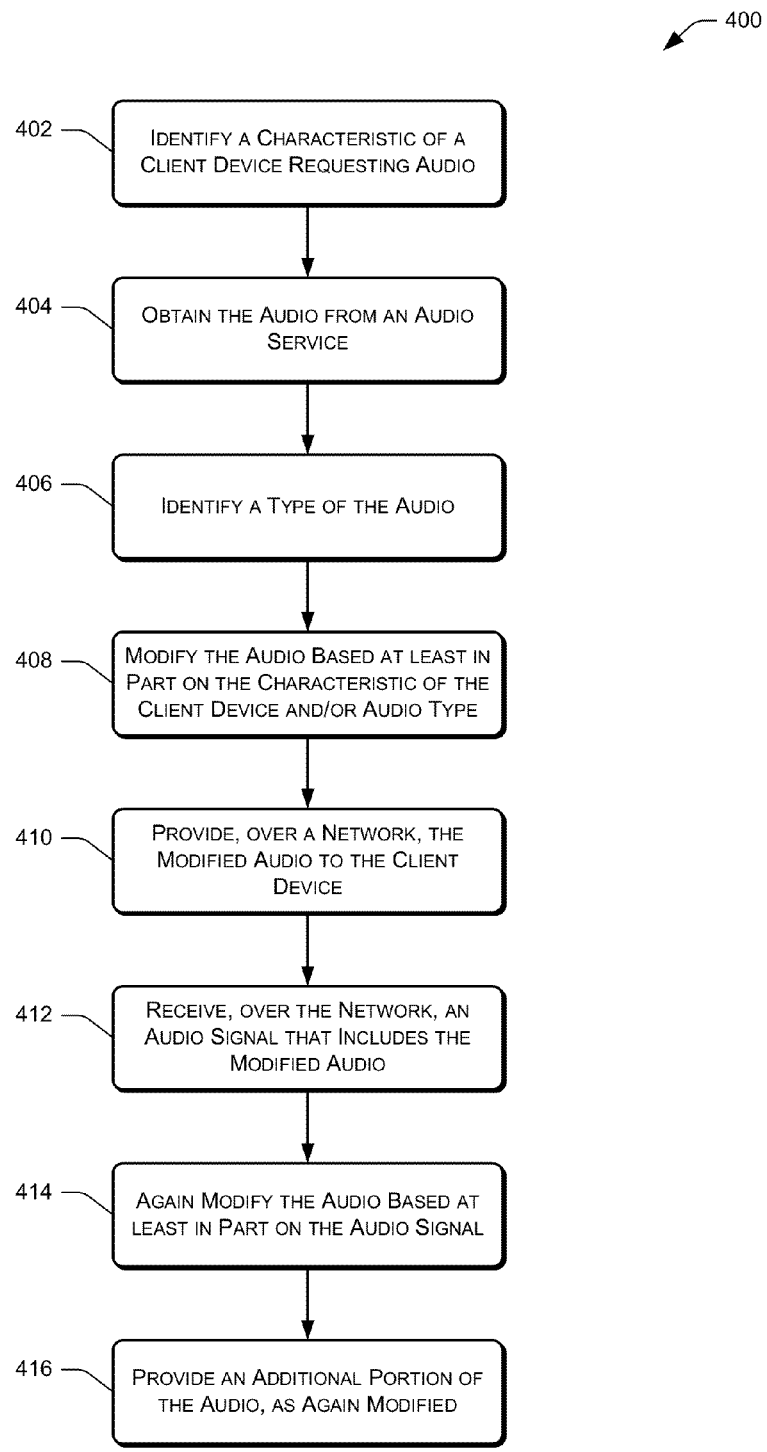
FIG. 4 depicts a flow diagram of an example process for modifying audio based on a characteristic of a client device and then providing, over a network, the audio to the client device.

FIG. 4 depicts a flow diagram of an example process 400 for modifying audio based on a characteristic of a client device and then providing, over a network, the audio to the client device. At 402, an entity, such as the remote computing resources 118 of FIG. 1, identifies a characteristic of a client device that is requesting to receive audio, such as music, an audio book, or the like. At 404, the resources 118 obtain the requested audio from an audio service and, at 406, identify a type of the audio. At 408, the resources modify the audio based at least in part on the characteristic of the client device and/or the audio type. At 410, the resources 118 provide, over a network, the modified audio to the client device.

At 412, the resources 118 may later receive, over the network, an audio signal that includes the modified audio as played back by the client device. At 414, the resources 118 may again modify the audio based at least in part on the audio signal and, at 416, may provide an additional portion of the audio, as modified, to the client device. The process 400 may periodically, randomly, or continuously implement this feedback loop to improve the quality of the audio output at the client device.

Figure 5:
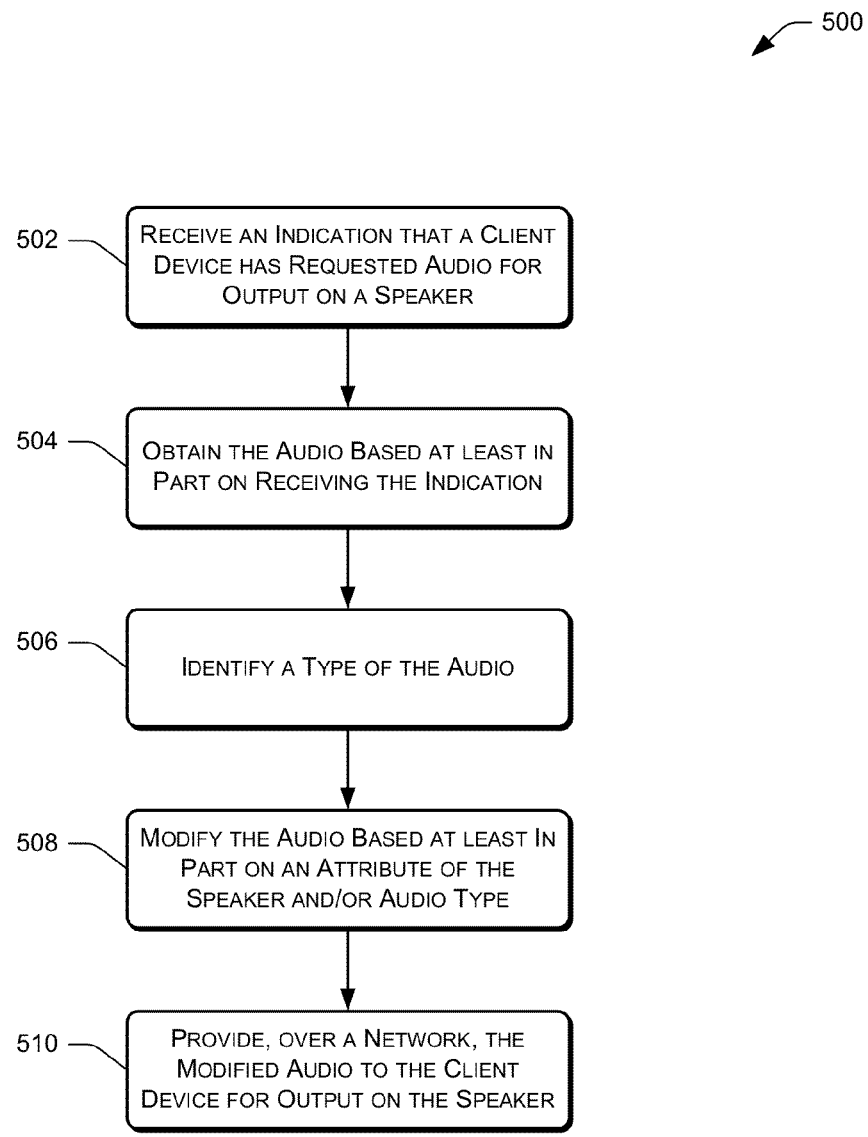
FIG. 5 depicts a flow diagram of an example process for modifying audio based on an attribute of a speaker and then providing, over a network, the audio to a client device.

FIG. 5 depicts a flow diagram of an example process 500 for modifying audio based on an attribute of a speaker and then providing, over a network, the audio to a client device. At 502, an entity, such as the remote computing resources 118 of FIG. 1, receives an indication that a client device has requested audio for output on a speaker of the client device. At 504, the resources 118 obtain the audio and, at 506, identify a type of the audio. At 508, the resources 118 modify the audio based at least in part on an attribute of the speaker, based on the audio type, and/or based on preferences of a user or application. Finally, at 510 the resources provide, over a network, the modified audio to the client device for output on the speaker.

Figure 6:
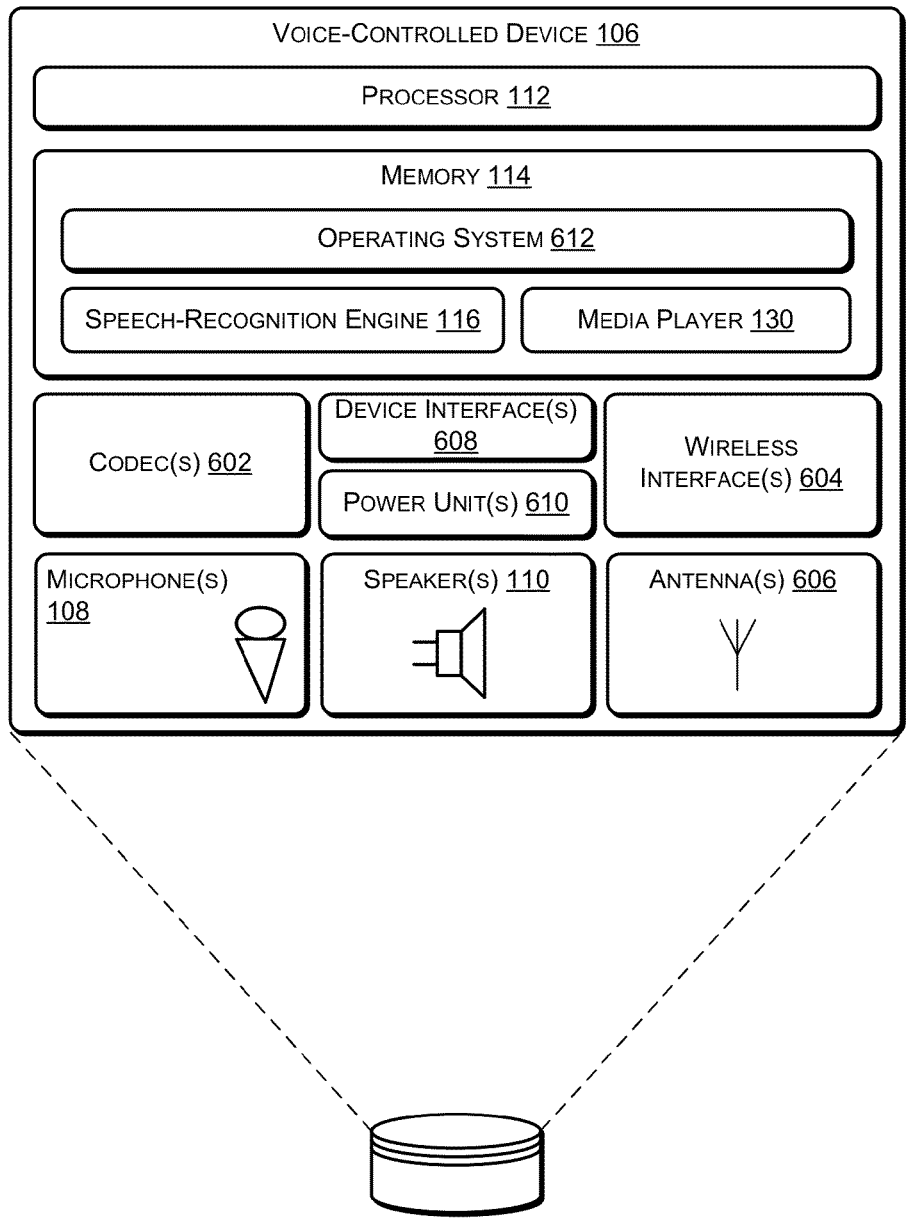
FIG. 6 shows a block diagram of selected functional components implemented in the voice-controlled device of FIG. 1.

FIG. 6 shows selected functional components of one implementation of the voice-controlled device 106 in more detail. Generally, the voice-controlled device 106 may be implemented as a standalone device that is relatively simple in terms of functional capabilities with limited input/output components, memory and processing capabilities. For instance, the voice-controlled device 106 does not have a keyboard, keypad, or other form of mechanical input in some implementations, nor does it have a display or touch screen to facilitate visual presentation and user touch input. Instead, the device 106 may be implemented with the ability to receive and output audio, a network interface (wireless or wire-based), power, and limited processing/memory capabilities.

In the illustrated implementation, the voice-controlled device 106 includes the processor 112 and memory 114. The memory 114 may include computer-readable storage media ("CRSM"), which may be any available physical media accessible by the processor 112 to execute instructions stored on the memory. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other medium which can be used to store the desired information and which can be accessed by the processor 112.

The voice-controlled device 106 includes a microphone unit that comprises one or more microphones 108 to receive audio input, such as user voice input. The device 106 also includes a speaker unit that includes one or more speakers 110 to output audio sounds. One or more codecs 602 are coupled to the microphone(s) 108 and the speaker(s) 110 to encode and/or decode the audio signals. The codec may convert audio data between analog and digital formats. A user may interact with the device 106 by speaking to it, and the microphone(s) 108 captures sound and generates an audio signal that includes the user speech. The codec 602 encodes the user speech and transfers that audio data to other components. The device 106 can communicate back to the user by emitting audible statements through the speaker(s) 110. In this manner, the user interacts with the voice-controlled device simply through speech, without use of a keyboard or display common to other types of devices.

In addition, in some instances users may interact with the voice-controlled device 106 using a device other than the device 106. For instance, a user may utilize a companion application through which the user may provide requests to and receive responses from the voice-controlled device 106. In one particular example, the companion application may comprise a web-based application that is executable on any client computing device, such that a user may provide requests to the voice-controlled device, such as requests to play music, add items to list, purchase an item on behalf of the user, or the like. In addition, the device 106 may provide content for output on the application, such as a confirmation that the device 106 will begin playing the music requested by the user.

In the illustrated example, the voice-controlled device 106 includes one or more wireless interfaces 604 coupled to one or more antennas 606 to facilitate a wireless connection to a network. The wireless interface 604 may implement one or more of various wireless technologies, such as wifi, Bluetooth, RF, and so on.

One or more device interfaces 608 (e.g., USB, broadband connection, etc.) may further be provided as part of the device 106 to facilitate a wired connection to a network, or a plug-in network device that communicates with other wireless networks. One or more power units 610 are further provided to distribute power to the various components on the device 106.

The voice-controlled device 106 is designed to support audio interactions with the user, in the form of receiving voice commands (e.g., words, phrase, sentences, etc.) from the user and outputting audible feedback to the user. Accordingly, in the illustrated implementation, there are no or few haptic input devices, such as navigation buttons, keypads, joysticks, keyboards, touch screens, and the like. Further there is no display for text or graphical output. In one implementation, the voice-controlled device 106 may include non-input control mechanisms, such as basic volume control button(s) for increasing/decreasing volume, as well as power and reset buttons. There may also be one or more simple light elements (e.g., LEDs around perimeter of a top portion of the device) to indicate a state such as, for example, when power is on or to indicate when a command is received. But, otherwise, the device 106 does not use or need to use any input devices or displays in some instances.

Several modules such as instruction, datastores, and so forth may be stored within the memory 114 and configured to execute on the processor 112. An operating system module 612 is configured to manage hardware and services (e.g., wireless unit, Codec, etc.) within and coupled to the device 106 for the benefit of other modules.

In addition, the memory 114 may include the speech-recognition engine 116 and the media player 130. In some instances, some or all of these engines, data stores, and components may reside additionally or alternatively at the remote computing resources 118.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. One or more computing devices comprising:
   one or more processors; and
   one or more computer-readable media storing computer-executable instructions that, when executed by the one or more processors, cause the one or more processors to perform acts comprising:
   receiving, from a client device and over a network, a request to stream audio to the client device;
   identifying a characteristic of a speaker of the client device, the characteristic of the speaker of the client device comprising a make, model, or manufacturer associated with the speaker of the client device;
   obtaining the audio requested by the client device;
   modifying the audio based at least in part on the characteristic of the speaker of the client device; and
   streaming, over the network, the modified audio to the client device.

2. One or more computing devices as recited in claim 1, wherein obtaining the audio requested by the client device comprises obtaining the audio from an audio service that is independent of the one or more computing devices.

3. One or more computing devices as recited in claim 1, wherein modifying the audio comprises adjusting at least one of an amplitude of a frequency of the audio, an amplitude of the audio, the equalization of the audio, or adjusting a dynamic range of the audio.

4. A system that is remotely located from a client device, the system comprising:
   one or more processors; and
   one or more computer-readable media storing computer-executable instructions that, when executed by the one or more processors, cause the one or more processors to perform acts comprising:
   identifying a characteristic of a speaker of the client device;
   modifying audio requested by the client device based at least in part on the characteristic of the speaker; and streaming, over a network from the system to the client device, the modified audio.

5. A system as recited in claim 4, wherein identifying the characteristic of the speaker of the client device comprises identifying a make, model, manufacturer, or frequency response associated with the speaker of the client device.

6. A system as recited in claim 4, wherein modifying the audio comprises modifying an amplitude of a frequency of the audio, performing equalization to the audio, or modifying a dynamic range of the audio based at least in part on the characteristic of the speaker of the client device.

7. A system as recited in claim 4, the acts further comprising obtaining, over a network, the audio from an audio service at least partly prior to the modifying the audio.

8. A system as recited in claim 4, the acts further comprising:
identifying a class of audio requested by the client device;
and wherein the modifying is also based at least in part on the class of audio requested by the client device.

9. A system as recited in claim 8, wherein the class of audio comprises one of music, non-music, or an audio book.

10. A system as recited in claim 8, wherein the modifying comprises selecting an equalization for the audio based at least in part on the class of audio.

11. A system as recited in claim 4, the acts further comprising:
receiving, over the network, an audio signal generated by a microphone of the client device, the audio signal including at least a portion of the modified audio as output by a speaker of the client device;
again modifying the audio based at least in part on the audio signal; and
streaming an additional portion of the audio to the client device, as again modified.

12. A method comprising:
at a remote computing resource comprising one or more computing devices configured with executable instructions, wherein the remote computing resource is remotely located from a client device:
receiving an indication that the client device has requested audio for output on a speaker of the client device;
obtaining the audio based at least in part on the receiving of the indication;
modifying the audio based at least in part on an attribute of the speaker of the client device; and
streaming, over a network, the modified audio to the client device for output on the speaker of the client device.

13. A method as recited in claim 12, wherein modifying the audio comprises raising or lowering respective amplitudes of one or more frequency bands of the audio.

14. A method as recited in claim 12, wherein modifying the audio comprises modifying a ratio between the largest amplitude and the smallest amplitude of the audio.

15. A method as recited in claim 12, wherein the receiving of the indication further comprises receiving an identifier associated with the client device, and further comprising identifying the attribute of the speaker of the client device based at least in part on the identifier associated with the client device.

16. A method as recited in claim 12, further comprising:
identifying a class of the audio that the client device has requested;
and wherein the modifying is also based at least in part on the class of the audio.

17. A method as recited in claim 16, wherein the class of audio comprises one of music, non-music, or an audio book.

18. A method as recited in claim 16, wherein the modifying comprises selecting an equalization for the audio based at least in part on the class of audio.

19. A method as recited in claim 12, wherein the obtaining comprises obtaining the audio from an independent audio service prior to the modifying of the audio.

20. A method as recited in claim 12, wherein the obtaining comprises obtaining the audio from an account of a user associated with the client device.

\* \* \* \* \*